(12) United States Patent
Kim et al.

(10) Patent No.: US 7,914,713 B2
(45) Date of Patent: Mar. 29, 2011

(54) INK-BASED ELECTROMAGNETIC-WAVE SHIELDING FILM FOR DISPLAY DEVICE

(75) Inventors: Hyun Chul Kim, Seoul (KR); Myung Won Lee, Seoul (KR); Jin San Moon, Suwon-si (KR); Jung Chul Shin, Seoul (KR)

(73) Assignee: LG Electronics Inc., Seoul (KR)

( * ) Notice: Subject to any disclaimer, the term of this patent is extended or adjusted under 35 U.S.C. 154(b) by 195 days.

(21) Appl. No.: 11/744,064

(22) Filed: May 3, 2007

(65) Prior Publication Data

US 2007/0272439 A1 Nov. 29, 2007

(30) Foreign Application Priority Data

May 4, 2006 (KR) .................. 10-2006-0040473
Jul. 25, 2006 (KR) .................. 10-2006-0069697

(51) Int. Cl.
*B29D 11/00* (2006.01)
*B32B 1/00* (2006.01)

(52) U.S. Cl. ................ 264/1.7; 264/2.5; 264/104

(58) Field of Classification Search .......... 264/1.31, 264/1.34, 1.7, 104, 105, 2.5; 425/808; 430/7
See application file for complete search history.

(56) References Cited

U.S. PATENT DOCUMENTS 5,201,268 A * 4/1993 Yamamoto et al. ........... 101/170

FOREIGN PATENT DOCUMENTS

| JP | 14-057490 | 2/2002 |
| JP | 2003-318595 | * 11/2003 |
| JP | 16-087904 | 3/2004 |

OTHER PUBLICATIONS

Korean Office Action dated Apr. 30, 2007, 6 pages.

* cited by examiner

*Primary Examiner* — Mathieu D. Vargot
(74) *Attorney, Agent, or Firm* — Fish & Richardson P.C.

(57) ABSTRACT

An electromagnetic-wave shielding film of a display panel and a plasma display device are manufactured by transcribing a conductive ink material onto a substrate by an off-set process, and firing the conductive ink material to form a conductive material.

8 Claims, 7 Drawing Sheets

INK-BASED ELECTROMAGNETIC-WAVE SHIELDING FILM FOR DISPLAY DEVICE

This application claims the benefit of the Korean Patent Application No. 10-2006-0040473, filed on May 4, 2006, which is hereby incorporated by reference as if fully set forth herein. Also, this application claims the benefit of the Korean Patent Application No. 10-2006-0069697, filed on Jul. 25, 2006, which is hereby incorporated by reference as if fully set forth herein.

BACKGROUND

1. Field

This disclosure relates to a front filter of a display device and constituent materials of the front filter.

2. Discussion of the Related Art

The introduction of the multimedia age has spurred the need for display devices capable of achieving a higher resolution and larger size and representing colors more close to natural colors. Display device types include, for example, a cathode ray tube (CRT), a liquid crystal display (LCD), a plasma display panel (PDP), and a projection television (TV). Developments are being made to make display devices suitable for the display of high definition images.

Operation of display devices such as a PDP tends to produce electromagnetic waves that may be harmful to the human body. To shield the electromagnetic waves, a front filter may be provided at the front surface of a panel on which an image is displayed.

In the use of a PDP, if a gas discharge occurs in a discharge space between an upper panel and a lower panel, ultraviolet rays are generated by the gas discharge and introduced onto phosphors, thereby causing the phosphors to emit visible rays. With the visible rays, images can be displayed on a screen.

A glass type or film type front filter may be provided at the front surface of the PDP. The front filter consists of an electromagnetic-wave shielding film for shielding electromagnetic interference (EMI) and near infrared rays (NIR), a color compensating film, and an anti-reflection film for preventing the reflection of light introduced from the outside.

The electromagnetic-wave shielding film may include a conductive material deposited on a base film and having a mesh form. If necessary, the conductive material may be supported by a frame. The mesh shape of the conductive material is obtained by patterning the conductive material on the base film via a photolithography technique, an etching process, a sputtering method, or the like.

Patterning the conductive material to have a mesh form via a photolithography technique, etching process, or the like, may result in an excessive loss of materials and an increase in the number of processes to be performed, which may result in a complexity in manufacture.

In addition, fabricating the electromagnetic-wave shielding film by a sputtering method may result in a prolonged process time and a high resistance beyond an acceptable level. Also, if the firing temperature of the conductive material increases excessively, the properties of a substrate may be deteriorated.

SUMMARY

An ink may be used for the manufacture of an electromagnetic-wave shielding film that may be employed as a front filter of a display device.

In one general aspect, manufacturing a plasma display device includes transcribing a conductive ink material onto a substrate by an off-set process, and firing the conductive ink material to form a conductive material.

In another general aspect, a display device includes a panel for displaying image information and an electromagnetic-wave shielding film formed on a front surface of the panel and including a first layer that has a rounded surface and is made of a conductive material.

In another general aspect, a front filter of a display device includes a substrate, a resin layer bonded onto the substrate, and an electromagnetic-wave shielding film provided on the resin layer and formed by patterning a conductive material.

In another general aspect, manufacturing a front filter of a display device includes preparing a mold having recesses, forming an electromagnetic-wave shielding film by injecting ink into the recesses, sequentially applying a resin layer and a substrate on the electromagnetic-wave shielding film, drying the resin layer, and separating the mold.

Additional features and advantages will be apparent from the following description, including the drawings, and the claims.

It is to be understood that both the foregoing general description and the following detailed description are exemplary and explanatory and are intended to provide further explanation of the subject matter claimed.

DETAILED DESCRIPTION

Reference will now be made to the drawings. In general, the same reference numbers have been used throughout the drawings to refer to the same or like parts.

Figure 1:
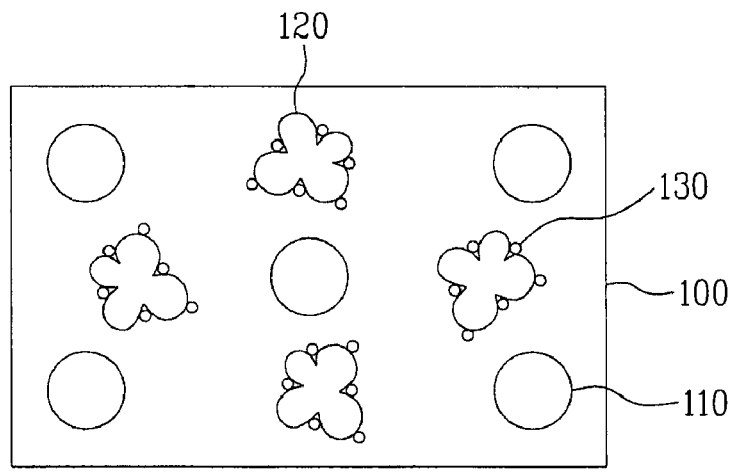
FIG. 1 is a view illustrating ink for the manufacture of an electromagnetic-wave shielding film.

FIG. 1 is a view illustrating an ink 100 for the manufacture of an electromagnetic-wave shielding film. The ink 100 contains a conductive material 120 and an organic material 130 dissolved in a solvent 110. The solvent 110 may be, for example, alcohol or glycol acetate. The conductive material 120 is selected from the group consisting of silver, copper, aluminum, stainless-steel, and nickel. The conductive material 120 has a low electric resistance and is capable of improving the shielding efficiency of electromagnetic waves. The organic material 130 includes at least one of cellulose, acryl and vinyl. The conductive material 120 has a weight percent of 65 to 85%, the organic material 130 has a weight percent of 10 to 30%, and the solvent 110 has a weight percent of 5 to 15%.

The conductive material 120 may be powder having a size of 0.5 to 5 micrometers. Here, the term "size" will denote, for example, a diameter if the powder is spherical powder, or an average length of edges if the powder is cubic powder. The conductive material 120, as shown in FIG. 1, may take the form of flakes. Referring to FIG. 1, in the ink 100, particles of the organic material 130 are adhered to each of the flakes of the conductive material 120. In general, the conductive material 120 is provided with the organic material 130 to reduce the temperature of a firing process that is described below.

In the case where the conductive material 120 is spherical or cubic powder, the size of the powder be in a range of 0.5 to 2 micrometers to allow a firing process to proceed at a predetermined temperature as described below. Since the above-mentioned flake form ensures a wide contact area between the conductive material 120 and the external environment, the conductive material may be rapidly fired even at a relatively low temperature. The firing process has the effect of facilitating easy contact between respective powder particles, and thereby reducing an electric resistance of the conductive material 120.

Figure 2:
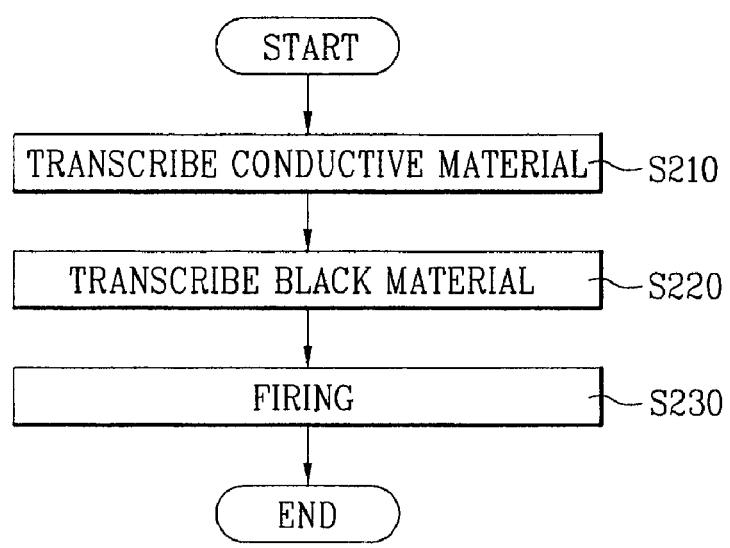
FIG. 2 is a flow chart illustrating a process for manufacturing an electromagnetic-wave shielding film.

FIG. 2 is a flow chart illustrating a process for forming an electromagnetic-wave shielding film. According to the process, a conductive material, such as the ink described above, is transcribed onto a substrate (S210). The transcription may be performed by an off-set method.

Next, a black material is transcribed onto the conductive material (S230). This transcription also may be performed by an off-set method. The black material is selected from the group consisting of copper oxide, cobalt oxide, nickel oxide, and carbon.

Subsequently, both the conductive material and the black material on the substrate are fired (S230). The firing temperature may be in a range of 100 to 400 degrees Celsius, and, more particularly, in a range of 100 to 200 degrees Celsius. The conductive material and the black material may be fired separately from each other, or may be fired simultaneously.

As described above, if powder of the conductive material or the black material takes the form of flakes, the firing temperature can be lowered to less than 200 degrees Celsius. After completion of the firing process, most of the solvent and organic material included in the conductive material is evaporated, and only the conductive material and the black material remain on the substrate.

The conductive material may be deposited on any one of a PET film, a glass substrate, and a display panel. As an alternative to convention techniques in which ink is directly transcribed and fired on a display panel, such that there is some likelihood of deterioration in the properties of a substrate due to a high firing temperature, the firing process of the described techniques can be performed at a lower temperature than the conventional firing temperature. As a result, ink can be directly transcribed and fired on a display panel.

With the above described process, an electromagnetic-wave shielding film is completed and manufacture of a display device may proceed using conventional techniques.

In the off-set method that may be used to apply the conductive ink, ink is deposited on the surface of a blanket having an embossed or recessed form. If the blanket is rolled on a substrate, ink comes "off" from the blanket and then is "set" on the substrate to form an electromagnetic-wave shielding film. According to the shape of protrusions or recesses defined on or in the surface of the blanket, an electromagnetic-wave shielding film of a stripe type, mesh type, or the like is patterned on the substrate.

Figure 3:
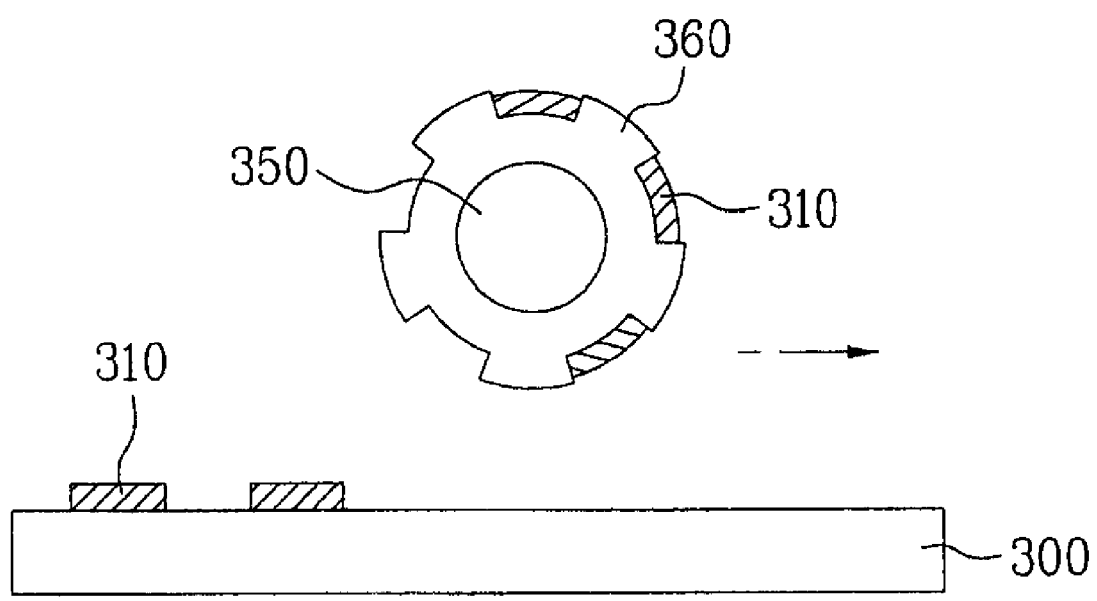
FIG. 3 is a side view illustrating a method for manufacturing an electromagnetic-wave shielding film based on an off-set method.

FIG. 3 is a view illustrating a method for manufacturing an electromagnetic-wave shielding film in which the off-set method is performed in such a manner that ink is injected into recesses defined in the surface of a blanket. Specifically, a blanket 360 is formed on the outer circumferential surface of a blanket roll 350. The surface of the blanket 360 is formed with recesses for the injection of ink 310. If the blanket 360 is rolled on a substrate 300, the ink 310, which was injected into the recesses of the blanket 360, is transcribed onto the substrate 300. Here, the composition and other properties of the ink 310 are as described above.

Figure 4A:
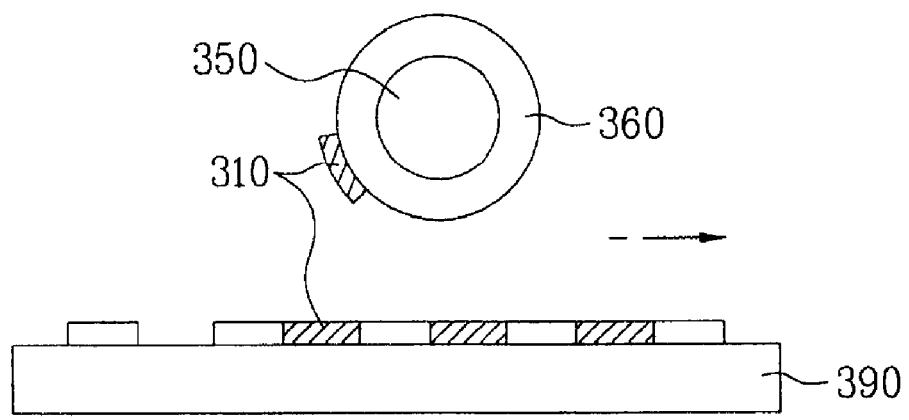
FIGS. 4A and 4B are side views illustrating a second method for manufacturing an electromagnetic-wave shielding film based on an off-set method.
Figure 4B:
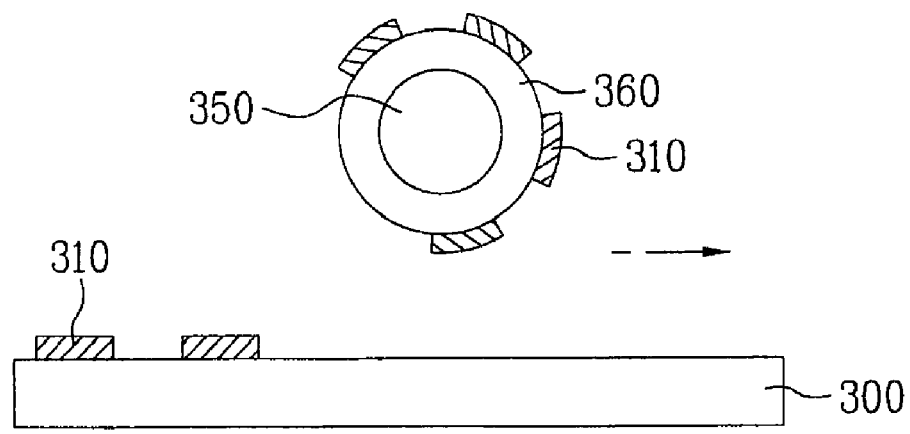

FIGS. 4A and 4B are views illustrating a second method for manufacturing an electromagnetic-wave shielding film based on the off-set method. In this method, ink is injected onto the surface of a blanket to have an embossed form. First, as shown in FIG. 4A, a master mold 390 having recesses is prepared. Then, the ink 310 is injected into the recesses. The ink 310 may be identical to the above described ink for the manufacture of an electromagnetic-wave shielding film. Subsequently, if the blanket 360, wound on the blanket roll 350, is rolled on the master mold 390, the ink 310, deposited in the recesses of the master mold 390, is transcribed onto the blanket 360. Thereafter, as shown in FIG. 4B, if the blanket 360, on which the ink 310 was deposited to have an embossed form, is rolled on the substrate 300 such that the ink 310 is transcribed onto the substrate 300.

After the conductive material is transcribed on the substrate by the off-set process as described above, the black material is transcribed on the conductive material. The black material also may be transcribed by the off-set process using the techniques described above. Both the transcribed conductive material and the black material are then subjected to firing. The firing temperature may be changed according to the size and shape of particles as discussed above.

As discussed, the conductive material is directly transcribed on the substrate as ink that has been deposited on the blanket. This has the effect of reducing the loss of material for the manufacture of the electromagnetic-wave shielding film constituting a display device and consequently, achieving reduced manufacturing costs. The off-set process has no need for exposure and developing processes and is efficient to shorten the overall manufacturing process. Also, when the conductive material is prepared by use of powder taking the form of flakes, as described above, the firing temperature can be lowered, and this is efficient to prevent deterioration in the properties of the substrate, for example.

A display device manufactured according to the described techniques generally corresponds to a conventional display device, but has an important feature in that an electromagnetic-wave shielding film is formed by the above described off-set process. Specifically, an electromagnetic-wave shielding film is formed on a panel that is used to display image information. The electromagnetic-wave shielding film includes a first layer made of a conductive material and a second layer made of a black material. Here, the first layer is formed by transcribing the above described ink for the manufacture of an electromagnetic-wave shielding film on a substrate by the off-set process. In general, substantially no solvents or binders remain because they are evaporated during a firing process. The thickness of the first layer may be in a range of 1 to 5 micrometers, and the thickness of the second layer may be in a range of 0.5 to 2 micrometers. The second layer, which is made of the black material, may be formed by the off-set process.

Figure 5:
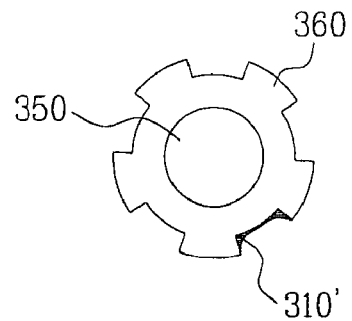
FIG. 5 is a side view illustrating a blanket after completion of the off-set method.
Figure 6A:
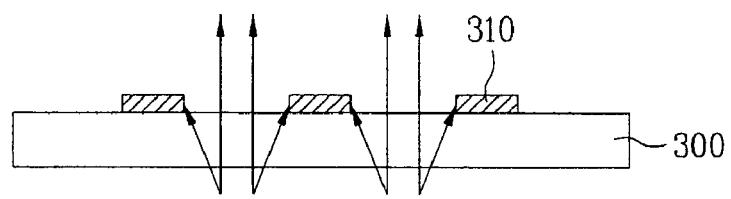
FIGS. 6A and 6B are side views illustrating operation of electromagnetic-wave shielding films.
Figure 6B:
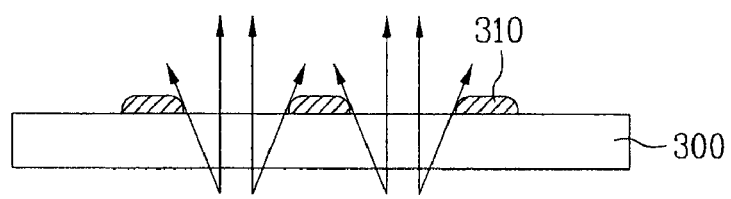

The first and second layers that are formed by the off-set process have a rounded surface as shown in FIG. 6B. This is because, as shown in FIG. 5, a part 310' of the ink 310 remains on the blanket 360 rather than being transcribed on, for example, the substrate during the off-set process.

The first layer may contain at least one of copper, silver, aluminum, stainless-steel, and nickel, and may take the form of flakes having a size of 0.5 to 5 micrometers. The conductive material may be spherical or cubic powder. The powder has a size of 0.5 to 2 micrometers to ensure successful firing of the conductive material at the above described firing temperature. The black material may be any one of copper oxide, cobalt oxide, nickel oxide, and carbon.

The electromagnetic-wave shielding film, which includes the conductive material and the black material, is formed on the front surface of the display device, thereby being capable of shielding electromagnetic waves discharged from the interior of the device. Also, as a result of forming both the conductive material and the black material by an inkjet method, it is possible to reduce the manufacturing costs and time of the display device and the amount of materials used.

FIG. 5 is a view illustrating a blanket after completion of the off-set process. Specifically, the illustrated blanket 360 is for use when ink is injected into the recesses of the blanket 360. As shown in FIG. 5, a part 310' of ink 310 remains in the recesses even after completion of the off-set process. As a result, as shown in FIG. 6B illustrating the function of the electromagnetic-wave shielding film, the conductive material 310 is formed on the substrate 300, to have a semi-circular or streamline shape. This allows an increased amount of visible rays, for example, to be discharged from the interior of the display device to the outside, resulting in an increase in the brightness of color.

FIG. 6A is a view illustrating the function of a conventional electromagnetic-wave shielding film. In FIG. 6A, since the conductive material 310 is formed orthogonally on the substrate 300, a part of visible rays from the interior of the display device cannot be easily discharged to the outside.

Other configurations of the display device, except for the above described electromagnetic-wave shielding film, may be identical to known display devices. It will be understood that the above described electromagnetic-wave shielding film is also usable in other display devices, including an LCD and portable terminal, as well as a plasma display panel.

Figure 7A:
FIG. 7A is a sectional view illustrating a front filter of a display panel.
Figure 7B:
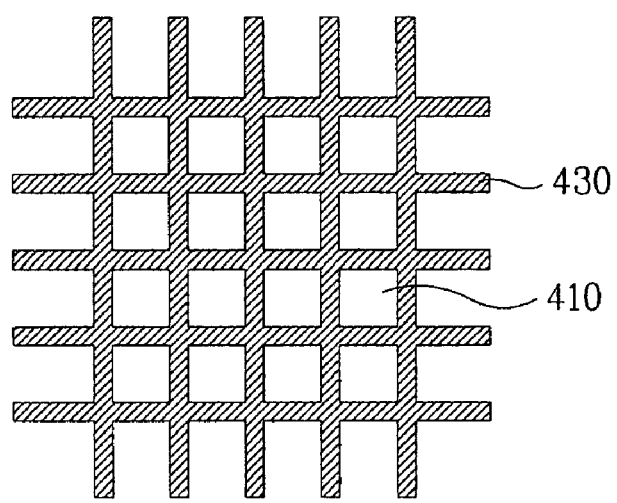
FIG. 7B is a plan view of the front filter of FIG. 7A.

FIG. 7A is a sectional view illustrating a front filter provided at the display panel, and FIG. 7B is a plan view of the front filter shown in FIG. 7A. The front filter includes an electromagnetic-wave shielding film that is formed by depositing a resin layer 410 on a substrate 400, and depositing and patterning a conductive material 420 on the resin layer 410. Here, the electromagnetic-wave shielding film serves to prevent electromagnetic waves discharged from the interior of the display device from coming out of a panel, or at least to reduce the discharge of such electromagnetic rays.

The electromagnetic-wave shielding film is formed by patterning the conductive material 420 having a low electric resistance. For example, the electromagnetic-wave shielding film may be formed by patterning any one of ink containing copper (Cu), silver (Ag), or the like, Ag paste, Cu paste, and $AgNO_3$ complex ink, and Ag complex ink, and the like, and drying the patterned ink or paste. The above mentioned inks and pastes have a feature of being injected into and patterned by a mold having recesses. The injection of the inks and pastes is performed by an inkjet method, for example.

When the electromagnetic-wave shielding film is formed only by use of the above described conductive material 420, there may occur glaring reflection of light irradiated from the outside of the display device. Therefore, to achieve an improved contrast, a black material 430 is further provided on the conductive material 420. To form the black material 430, non-conductive carbon, CoO-based, RuO-based, or Ni—Cu oxide-based paste or ink, or the like, is deposited to have a predetermined pattern, and the deposited paste or ink then is dried.

The thickness of the black material 430 may be equal to 10 to 50% of the overall thickness of the electromagnetic-wave shielding film. The above mentioned thickness is a sum of the thicknesses of the conductive material 420 and the black material 430.

In another implementation, to achieve an improved contrast, carbon, for example, may be added into the above described ink containing the conductive material, such as copper, silver, or the like, to blacken the ink before subjecting the resulting ink to the above described injection and drying processes.

Although a glass substrate, PET film, or the like may be used as the substrate 400 on which to construct a glass type front filter or film type front filter, a front glass surface of a plasma display panel also may be used. In this case, the front filter is directly formed on the front glass surface of the plasma display panel. An adhesive, such as a pressure sensitive adhesive (PSA) and the like, may be applied onto the substrate 400 and the resin layer 410.

The resin layer 410 contains a visco-elastic material, such as polydimethylsiloxane (PDMS), polymethylmethacrylate (PMMA), or ethylene-vinyl acetate (EVA), for example. The thickness of the resin layer 410 is in a range of 30 to 700 micrometers. In this case, the electromagnetic-wave shielding film to be formed in the resin layer 410 has a thickness of 20 to 200 micrometers. The conductive material 420 constituting the electromagnetic-wave shielding film has a line width of 10 to 30 micrometers, for achieving a desired opening ratio and electromagnetic wave shielding effect. The electromagnetic-wave shielding film is of a strip type or mesh type. Respective lines of the strip or mesh type electromagnetic-wave shielding film are spaced apart from one another by a distance of 150 to 500 micrometers, and more particularly, by a distance of 300 micrometers.

To enhance the performance of the front filter, one or more of a near infrared ray shielding film, a color compensating film, or an anti-reflection film, for example, may be formed on the above described resin layer 410. Also, dyes and the like for the compensation of color and the shielding of near infrared rays may be added into the above described resin layer 410. This has the effect of reducing the thickness and the weight of the front filter.

The front filter of the display device described above may be applicable to other fields of display devices requiring the electromagnetic wave shielding function, in addition to a plasma display panel.

A plasma display panel including the above described front filter may be configured such that an upper panel and a lower panel are bonded to each other with a predetermined distance therebetween. The upper panel has a front glass surface for displaying images, and a plurality of pairs of electrodes arranged on the front glass surface, with each pair of electrodes including a scan electrode and a sustain electrode. The lower panel has a plurality of address electrodes arranged on a rear glass surface so as to cross with the plurality of pairs of electrodes. The above described upper and lower panels are coupled parallel to each other with a predetermined distance therebetween.

The lower panel further has strip type (or well type) partitions that are arranged parallel to one another to define a plurality of discharge spaces that may be referred to as discharge cells. The plurality of address electrodes are arranged parallel to the partitions and adapted to produce vacuum ultraviolet rays by performing an address discharge. Red, green, and blue phosphors are applied onto an upper surface of the lower panel and adapted to emit visible rays required for displaying images during the address discharge. A lower dielectric layer is formed between the address electrodes and the phosphors to protect the address electrodes.

The above described front filter is formed on the front glass surface of the upper panel. The front filter, as described above, is obtained as the conductive material and the black ink are patterned on the resin layer to form the electromagnetic-wave shielding film. By forming the near infrared ray shielding film, color compensating film, or anti-reflection film, for example, on the resin layer having the above described electromagnetic-wave shielding film, the performance of the front filter can be enhanced. In addition, by providing the resin layer with dyes and the like for the compensation of color and the shielding of near infrared rays, the front filter can achieve a reduced thickness and weight.

FIG. 7B is a plan view of the front filter of FIG. 7A. The black material 430 is patterned into a stripe form on the resin layer 410. The conductive material is provided between the resin layer 410 and the black material 430.

FIGS. 8 to 12 are views illustrating a process for manufacturing the front filter of the display device. The manufacturing process of the front filter included in the display device will be described with reference to FIGS. 8 to 12.

Figure 8:
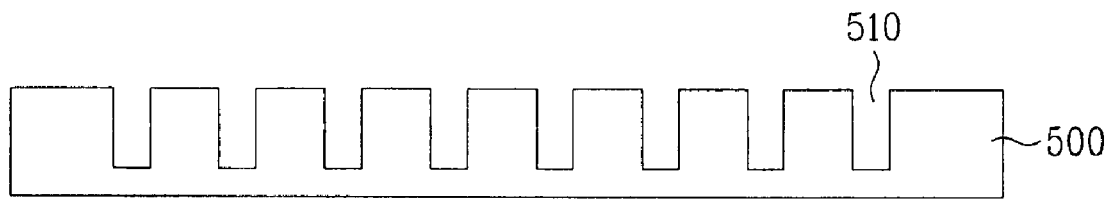
FIGS. 8 to 12 are views illustrating a display device manufacturing process.

First, as shown in FIG. 8, a mold 500 having recesses 510 is prepared. The mold 500 serves as means for injecting ink and the like to form the electromagnetic-wave shielding film as described below. Although the recesses 510 formed in the mold 500, as shown in FIG. 8, have a rectangular sectional shape, and more particularly, a three dimensional cubic shape, the shape of the recesses may be changed according to the shape of a desired electromagnetic-wave shielding film. For example, if the conductive material constituting the electromagnetic-wave shielding film has a line width gradually decreasing toward the outside of the front filter, the shape of the recesses 510 may be changed to conform to the shape of the conductive material. Also, a specific material, such as conductive ink, to be injected into the recesses 510 is located at the outermost portion of the front filter.

The pattern of the recesses 510 may be changed according to the pattern of a desired electromagnetic-wave shielding film to be formed. For example, the recesses 510 may have a stripe form or a mesh form. Each recess 510 has a width of suitable to achieve a desired opening ratio and electromagnetic wave shielding effect. For example, recesses may have widths of 10 to 30 micrometers. Also, the respective recesses 510 must be spaced apart from one another by a distance of 150 to 500 micrometers, and, more particularly, by a distance of approximately 300 micrometers. The above mentioned distance between the recesses 510 is a distance between the centers of the respective neighboring recesses 510. The depth of the recesses 510 may be equal to the thickness of the electromagnetic-wave shielding film, such that the depth is in a range of 20 to 200 micrometers.

Figure 9:
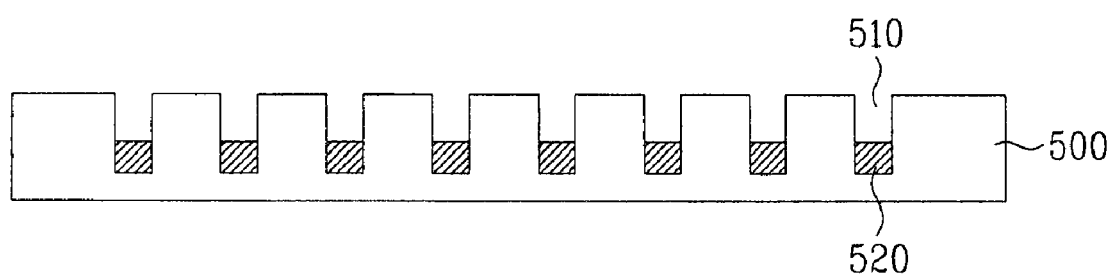

Next, as shown in FIG. 9, a black material 520 is injected into the recesses 510. The black material 520 is selected from among non-conductive carbon, CoO-based, RuO-based, or Ni—Cu oxide-based paste or ink, or the like. The black material 520 is deposited on the basis of the pattern of the recesses 510 and then is subjected to drying. The black material 520 is formed on the conductive material to achieve an improved contrast because, when the electromagnetic-wave shielding film has only the conductive material, there may occur glaring reflection of light irradiated from the outside of the display device. The black material 530 is obtained by depositing non-conductive carbon, CoO-based, RuO-based, or Ni—Cu oxide-based paste or ink, or the like to have a predetermined pattern, and drying the deposited paste or ink pattern. The above described black material 520 is applied by an inkjet method, for example, and injected into the recesses 510 by a height corresponding to 10 to 15% of the overall depth of the recesses 510.

Figure 10:
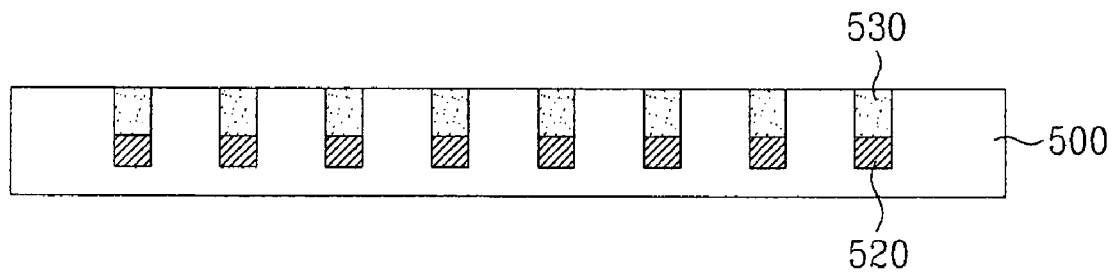

Subsequently, as shown in FIG. 10, a conductive material 530 is injected onto the black material 520. In this case, the conductive material 530 may be injected into the remaining space of the recesses 510, which were partially filled with the black material 520, by an inkjet method, for example. The conductive material 530 should be a material having a low electric resistance and thus, superior electromagnetic wave shielding effect. The conductive material may be any one of ink containing copper (Cu), silver (Ag), or the like, Ag paste, Cu paste, AgNO$_3$ complex ink, and Ag complex ink.

The conductive material 530 and the black material 520 may be separately dried from each other, or may be dried simultaneously. Also, if an excessive amount of conductive material and/or black material is injected into the recesses, a part of the material may overflow over the surface of the mold 500 such that the mold 500 has an irregular surface. In this case, a doctoring process using a metal or plastic blade may be added.

Although FIGS. 9 and 10 illustrate a double-layered structure in which the black material and the conductive material are injected in sequence, in an alternative implementation, to achieve an improved contrast, carbon and the like may be added into the above described ink containing the conductive material, such as copper, silver, or the like, to blacken the ink. Thereafter, the resulting ink may be subjected to the above described injection and drying processes.

Figure 11:
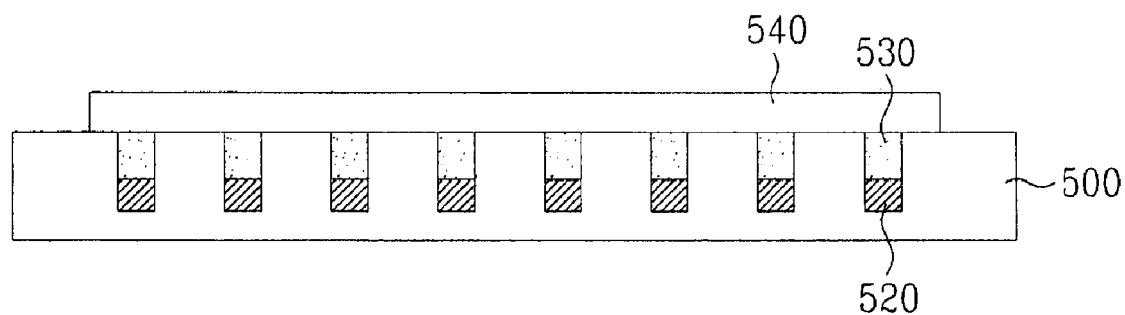

In sequence, as shown in FIG. 11, a resin layer 540 is applied and dried on the mold 500 having the recesses 510 into which the black material 520 and the conductive material 530 were sequentially injected. The resin layer 540 is bonded to the substrate as will be described hereinafter, and serves to fix the electromagnetic-wave shielding film and to absorb an external shock. The resin layer 540 is formed of a visco-elastic material, such as PDMS, PMMA, or EVA, for example, and has a thickness of 30 to 700 micrometers. As the resin layer 540 is dried, the resin layer 540 can achieve an enhanced external shock-absorbing ability equal to 1.5 to 2 times of a conventional resin layer while efficiently maintaining the shape of the front filter. The resin layer 540 is made of a transparent material because it forms a part of the front filter.

Figure 12:
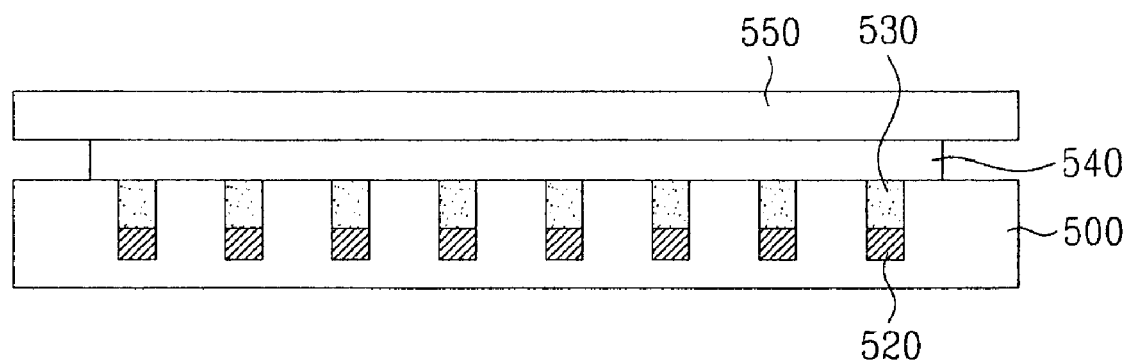

Thereafter, as shown in FIG. 12, a substrate 550 is bonded to the resin layer 540. If the substrate 550 is made of glass, the resulting front filter will be a glass type front filter. Also, if the substrate 550 is made of a film, such as a PET film, the resulting front filter will be a film type front filter. The resin layer 540 may be deposited directly on the front glass surface of a plasma display panel. An adhesive, such as PSA and the like, may be used between the resin layer 540 and the substrate.

If the mold 500 is separated after drying the resin layer 540, as shown in FIG. 12, the front filter of the display device is completed. The above described drying temperature may be in a range of 50 to 300 degrees Celsius. With the drying process, the resin layer 540 can achieve an increased coupling force with respect to the substrate 550 and the conductive material 530.

The front filter, completed through the above described processes, may be provided at the front surface of a display device, such as a plasma display panel and the like, requiring an electromagnetic wave shielding function. When being used in the plasma display panel, a near infrared shielding film, a color compensating film, an anti-reflection film, and the like may be further formed on the resin layer, to enhance the performance of the front filter. Also, when adding dyes, for example, for the compensation of color and the shielding of near infrared rays into the resin layer 540, the effect of reducing the weight and the thickness of the front filter can be accomplished.

Other implementations are within the scope of the following claims.

What is claimed is:

1. A method for manufacturing a front filter of a display device comprising:
    preparing a mold having recesses;
    injecting a black material into the recesses;
    drying the black material;
    injecting a conductive material onto the black material;
    drying the conductive material;
    sequentially applying a resin layer and a substrate on the mold having the recesses, into which the black material and the conductive material are injected;
    drying the resin layer; and
    forming an electromagnetic-wave shielding film on the substrate by separating the mold, wherein the black material fills from 10% to 15% of a depth of the recesses.

2. The method according to claim 1, wherein preparing comprises configuring the recesses to have a line width of 10 to 30 micrometers.

3. The method according to claim 1, wherein preparing comprises configuring the respective recesses to be spaced apart from one another by a distance of 150 to 500 micrometers.

4. The method according to claim 1, wherein drying the resin layer is performed at a temperature of 50 to 300 degrees Celsius.

5. The method according to claim 1, wherein preparing comprises configuring the recesses to have a width that decreases with the depth of the recesses.

6. The method according to claim 1, wherein preparing comprises configuring the recesses to be arranged in at least one of a stripe pattern and a mesh pattern.

7. The method according to claim 1, further comprising selecting the black material from the group consisting of a CoO-based ink, a RuO-based ink, and Ni—Cu oxide-based ink.

8. The method according to claim 1, wherein the resin layer comprises a transparent visco-elastic material.

* * * * *